(12) United States Patent
Byeon (10) Patent No.: US 7,649,785 B2
(45) Date of Patent: Jan. 19, 2010

(54) FLASH MEMORY DEVICE AND RELATED HIGH VOLTAGE GENERATING CIRCUIT

(75) Inventor: Dae-Seok Byeon, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 307 days.

(21) Appl. No.: 11/785,309

(22) Filed: Apr. 17, 2007

(65) Prior Publication Data

US 2007/0274133 A1    Nov. 29, 2007

(30) Foreign Application Priority Data

May 24, 2006    (KR)    ...... 10-2006-0046669

(51) Int. Cl.
*G11C 11/03* (2006.01)
(52) U.S. Cl. ............ 365/185.25; 365/185.05; 365/189.07; 365/189.11; 365/230.08
(58) Field of Classification Search ............ 365/185.25, 365/189.05, 189.07, 230.08, 185.33, 189.11
See application file for complete search history.

(56) References Cited

U.S. PATENT DOCUMENTS

| | | | |
|---|---|---|---|
| 6,498,761 B2 | 12/2002 | Banba et al. | |
| 6,529,413 B2 * | 3/2003 | Lee et al. | 365/185.22 |
| 6,563,746 B2 | 5/2003 | Fujioka et al. | |
| 6,580,644 B1 * | 6/2003 | Chung | 365/185.22 |
| 7,319,617 B2 * | 1/2008 | Park | 365/185.25 |
| 7,512,010 B2 * | 3/2009 | Cho et al. | 365/185.23 |

FOREIGN PATENT DOCUMENTS

| | | |
|---|---|---|
| JP | 10-208488 | 8/1998 |
| JP | 10-243637 | 9/1998 |
| KR | 19880011500 A | 4/1998 |
| KR | 1020000028302 A | 5/2000 |
| KR | 10-1998-0071820 | 9/2005 |
| KR | 102005008877 A | 9/2005 |

* cited by examiner

*Primary Examiner*—Pho M. Luu
(74) *Attorney, Agent, or Firm*—Volentine & Whitt, PLLC

(57) ABSTRACT

A flash memory device is disclosed and includes; a memory cell array, a high voltage generating circuit generating a high voltage applied to a selected word line to select one or more memory cells in the memory cell array, and a controller. The controller cuts off a discharge path between the high voltage generating circuit and ground during a first period wherein the high voltage is not applied to a word line. The controller also deactivates the high voltage generating circuit during this first period.

12 Claims, 5 Drawing Sheets

FLASH MEMORY DEVICE AND RELATED HIGH VOLTAGE GENERATING CIRCUIT

BACKGROUND OF THE INVENTION

1. Field of the Invention

Embodiments of the invention relate generally to non-volatile memory devices. More particularly, embodiments of the invention relate to flash memory devices and related high voltage generating circuits.

A claim of priority is made to Korean Patent Application No. 2006-46669 filed on May 24, 2006, the disclosure of which is hereby incorporated by reference.

2. Description of Related Art

Semiconductor memory devices can be roughly divided into volatile memory devices and non-volatile memory devices. In general, volatile memory devices tend to have faster performance than non-volatile memory devices. However, volatile memory devices generally lose stored data when disconnected from an external power source, whereas non-volatile memory devices retain stored data when disconnected from an external power source.

Due to their ability to retain stored data when disconnected from an external power source, non-volatile memory devices are a popular choice for portable electronic devices such as cellular phones, mp3 players, digital cameras, and so on. Examples of non-volatile memory devices include masked read only memory (MROM), programmable read only memory (PROM), erasable and programmable read only memory (EPROM), and electrically erasable and programmable read only memory (EEPROM), to name but a few.

Among non-volatile memory devices, flash memory devices constitute one especially popular form of EEPROM. Flash memory devices are popular, at least in part, due to their relatively high degree of integration, low power consumption, and their ability to withstand physical shock.

In general, flash memory devices can be categorized into different types based on the organization of flash memory cells into different array structures and according to different read/program characteristics. For example, NAND flash memory devices and NOR flash memory devices each have different array structures and different read/program characteristics providing unique tradeoffs and advantages. In particular, NAND flash memory devices tend to have a higher degree of integration, but slower read times, than NOR flash memory devices. Accordingly, NAND flash memory devices are commonly used to provide mass data storage, while NOR flash memory devices are often used to provide storage for data requiring quick access, such as program code.

In NAND flash memory devices, memory cells are typically erased and programmed using Fowler-Nordheim (FN) tunneling. Selected methods for erasing and programming NAND flash memory devices using FN tunneling are disclosed, for example, in U.S. Pat. Nos. 5,473,563 and 5,696,717, entitled "NONVOLATILE SEMICONDUCTOR MEMORY" and "NONVOLATILE INTEGRATED CIRCUIT MEMORY DEVICES HAVING ADJUSTABLE ERASE/PROGRAM THRESHOLD VOLTAGE VERIFICATION CAPABILITY", respectively.

NAND flash memory devices can be programmed using a variety of different programming techniques. One common technique used to program NAND flash memory devices is called an incremental step pulse programming (ISPP) technique. In the ISPP technique, a program voltage is applied to a control gate of one or more selected memory cells in a NAND flash memory device in successive program loops until the respective threshold voltages of the selected memory cells reach desired magnitudes. In each successive program loop, the magnitude of the program voltage is increased in order to raise the threshold voltages of the selected memory cells. Selected embodiments of the ISPP technique are disclosed, for example, in U.S. Pat. No. 5,642,309, entitled "AUTO-PROGRAM CIRCUIT IN A NONVOLATILE SEMICONDUCTOR MEMORY DEVICE".

Figure 1:
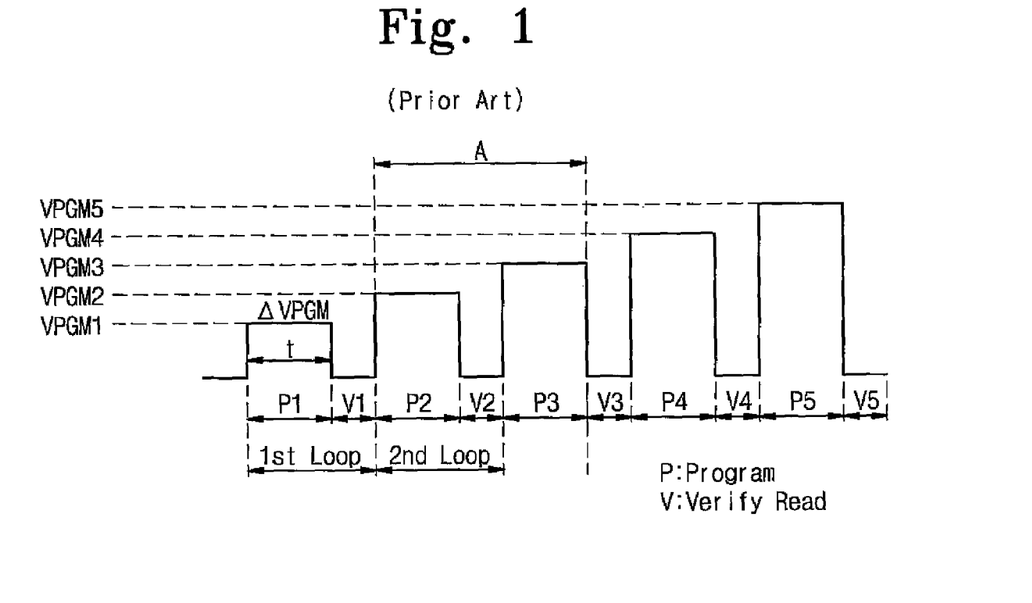
FIG. 1 is a waveform timing diagram illustrating a program voltage during a program operation of a NAND flash memory device using an ISPP technique.

FIG. 1 is a voltage diagram illustrating a change of a program voltage in a NAND flash memory device during a programming operation using the ISPP technique.

Referring to FIG. 1, the NAND flash memory device receives a program command, a program address, and program data for programming a page of selected memory cells. The program data is loaded into a page buffer circuit and the selected memory cells are identified based on the program address. After the program data is loaded into the page buffer, the program data is simultaneously programmed into the selected memory cells.

In general, the program data is programmed into the selected memory cells using a plurality of program loops each comprising a program period "P" and program verification period "V". In each program period "P", the program voltage is applied to a word line connected to the selected memory cells, and appropriate program bias voltages are applied to respective bit lines connected to the selected memory cells based on the program data.

FIG. 1 illustrates five (5) program loops including program periods "P1" through "P5" each having a duration "t", and corresponding program verification periods "V1" through "V5". During the five program loops, the program voltage is incrementally increased from a magnitude VPGM1 to a magnitude VPGM5. In each successive program loop, the magnitude of the program voltage changes by an increment ΔVPGM.

During each program verification period, the NAND flash memory device performs a verify read operation to determine whether the selected memory cells have reached desired threshold voltages. In the verify read operation, a read verify reference voltage is applied to the word line connected to the selected memory cells and appropriate read bias voltages are applied to respective bit lines connected to the selected memory cells based on the program data. The read verify operation is then able to determine whether the selected memory cells have reached the desired threshold voltages based on the current conduction characteristics of the selected memory cells under these conditions.

In order to successfully program the selected memory cells using the ISPP technique, the NAND flash memory device must be able to accurately control the magnitude of the program voltage. This is especially true when programming memory cells having relatively small read margins, such as multi-level NAND flash memory cells, because where read margins are small, minor fluctuations in the magnitude of the program voltage can produce undesired threshold voltages, or in other words, wrongly programmed memory cells. For example, in the case of programming multi-level NAND flash memory cells, the duration of each program period "P" may be relatively small, and the magnitude of the program voltage may be relatively large compared with the increment ΔVPGM. Accordingly, absent accurate control of the program voltage, undesired variations in the timing and magnitude of the program voltage may exceed acceptable margins for increment ΔVPGM and duration "t".

For at least the above reasons, it is desirable to develop reliable, accurate, and stable ways of producing a high voltages in semiconductor devices.

SUMMARY OF THE INVENTION

According to one embodiment of the invention, a flash memory device comprises a memory cell array, a high voltage generating circuit, and a controller. The memory cell array comprises a plurality of memory cells arranged at intersections of a plurality of word lines and bit lines. The high voltage generating circuit is adapted to generate a high voltage to be applied to a selected word line among the plurality of word lines to select one or more memory cells among the plurality of memory cells. The controller is adapted to cut off a discharge path between the high voltage generating circuit and outside of the flash memory device during a first period where the high voltage is not applied to any of the plurality of word lines, and further adapted to deactivate the high voltage generating circuit during the first period.

According to another embodiment of the invention, a high voltage generating circuit comprises a charge pump, a voltage dividing circuit, a discharging circuit, a comparing circuit, and a controlling circuit. The charge pump is adapted to generate a high voltage in response to a pumping clock signal; a voltage dividing circuit adapted to divide the high voltage to produce a divided voltage result. The discharging circuit is adapted to activate a discharge path located between the voltage dividing circuit and ground in response to an internal floating signal. The comparing circuit is adapted to compare the divided voltage result with a reference voltage to produce a compare signal. The controlling circuit is adapted to generate the pumping clock signal in response to the compare signal, further adapted to deactivate the pumping clock signal in response to a control signal output by the controller during a first period, and further adapted to deactivate the internal floating signal. The discharge circuit cuts off the discharge path in response to the deactivated internal floating signal.

BRIEF DESCRIPTION OF THE DRAWINGS

Embodiments of the invention are described in relation to the accompanying drawings. Throughout the drawings like reference numbers indicate like exemplary elements, components, and steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims, that follow.

In general, selected embodiments of the invention provide flash memory devices adapted to cut off a discharge path of a high voltage generating circuit and deactivate a pumping clock signal during a program verification period of a program operation. This prevents leakage current and a charge pumping operation from occurring during the program verification period.

A high voltage generating circuit for a non-volatile memory device such as a flash memory is used as one example to illustrate selected features and functions provided by the invention. However, those skilled in the art will recognize that the invention may be embodied by a number of different variations.

Figure 2:
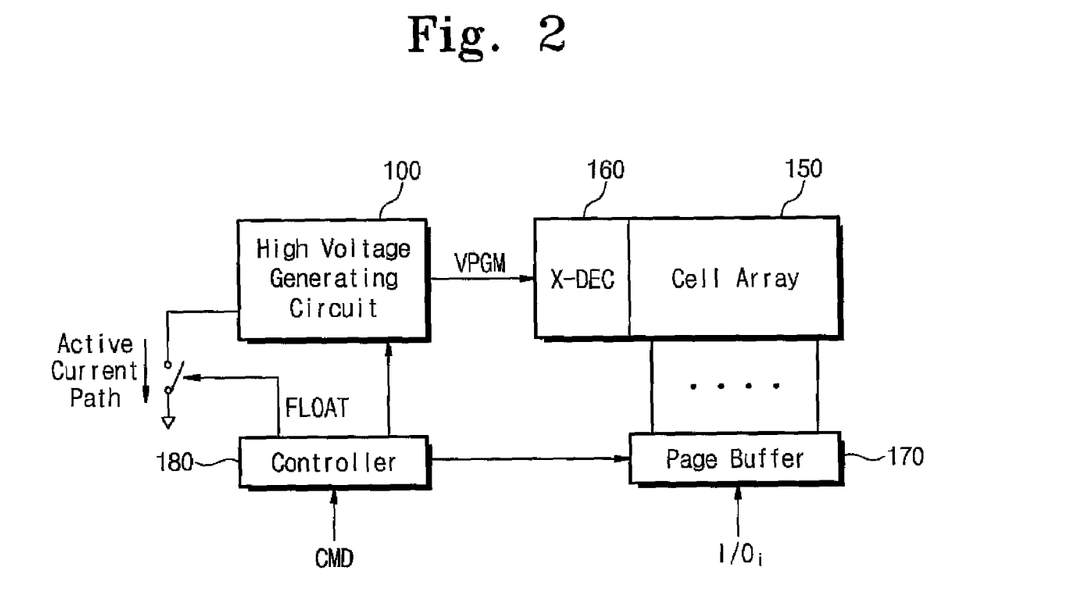
FIG. 2 is a block diagram of a flash memory device according to one embodiment of the invention.

FIG. 2 is a block diagram illustrating a flash memory device according to one embodiment of the invention. For explanation purposes, it will be assumed that the flash memory device is a NAND flash memory device.

Referring to FIG. 2, the flash memory device comprises a high voltage generating circuit 100, a memory cell array 150, a row decoding circuit 160, a page buffer circuit 170, and a controller 180.

Memory cell array 150 comprises a plurality of memory blocks. Each of the memory blocks comprises a plurality of NAND strings each comprising a string select transistor, a ground select transistor, and a plurality of floating gate transistors functioning as memory cells. Channels of the floating gate transistors are connected in series between the string select transistor and the ground select transistor.

Memory cell array 150 is organized into a matrix comprising a plurality of word lines corresponding to rows of the matrix, and a plurality of bit lines corresponding to columns of the matrix. Each word line is connected to control gates of a corresponding page of floating gate transistors in the matrix. Each bit line is connected to a corresponding one of the NAND strings.

Row decoding circuit 160 drives the rows of memory cell array 150 and page buffer circuit 170 drives the columns of memory cell array 150. Row decoding circuit 160 selects one of the plurality of word lines based on a row address. Word line voltages are then applied to the selected word line and to unselected word lines based on an operation mode of the flash memory device. For example, during a program operation mode, row decoding circuit 160 supplies a program voltage VPGM to the selected word line, and one of a pass voltage and a decoupling voltage to unselected word lines. On the other hand, during a read operation mode, row decoding circuit 160 supplies a read voltage to the selected word line and a ground voltage GND to unselected word lines.

Bit lines arranged in memory cell array 150 are electrically connected to page buffer circuit 170. Page buffer circuit 170 typically comprises a page buffer corresponding to each bit line. In general, each page buffer may be connected to a pair of bit lines. Page buffer circuit 170 is controlled by controller 180. Each page buffer in page buffer circuit 170 can serve as a sense amplifier or a write driver according to the operation mode of the flash memory device. For example, during the program operation mode, page buffer circuit 170 may supply a power voltage (or, a program-inhibit voltage) or a ground voltage (or, a program voltage) to the bit lines according to the program data. On the other hand, during a read or read verify operation mode, page buffer circuit 170 may detect data stored in the selected memory cells through the bit lines.

Controller 180 exercises control over the operation of the flash memory device. Controller 180 generates a plurality of enable signals ENABLE1 through ENABLE3 to generate a program voltage VPGM in response to a program command CMD received via input/output pins.

High voltage generating circuit 100 generates a high voltage (e.g., program voltage VPGM, the pass voltage, the decoupling voltage, or the read voltage) with a magnitude greater than a power voltage in response to enable signals ENABLE1 to ENABLE3 generated by controller 180. The structure of high voltage generating circuit 100 is described in further detail below. In the description that follows, high voltage generating circuit 100 is described as producing program voltage VPGM. However, it should be understood that high voltage generating circuit 100 could also be used to generate other voltages such as the pass voltage, the decoupling voltage, or the read voltage.

First enable signal ENABLE1 generated by controller 180 is used to activate high voltage generating circuit 100. Second and third enable signals ENABLE2 and ENABLE3 are used to adjust a magnitude of program voltage VPGM for successive program loops of a program operation. High voltage generating circuit 100 selectively outputs switching voltage VSWITCH according to an activation state of second and third enable signals ENABLE2 and ENABLE3.

Switching voltage VSWITCH controls a voltage dividing path of program voltage VPGM within high voltage generating circuit 100. As the voltage dividing path is controlled, a magnitude of program voltage VPGM generated by high voltage generating circuit 100 is adjusted.

High voltage generating circuit 100 receives a fed-back version of program voltage VPGM as switching voltage VSWITCH. Accordingly, high voltage generating circuit 100 does not require an additional circuit component for generating switching voltage VSWITCH.

The magnitude of switching voltage VSWITCH is controlled to stably generate program voltage VPGM. Where the magnitude of switching voltage VSWITCH is not sufficiently high, control of the voltage dividing path may become inaccurate, and program voltage VPGM may be generated with an unstable magnitude.

However, because high voltage generating circuit 100 uses program voltage VPGM as switching voltage VSWITCH, the magnitude of switching voltage VSWITCH reaches the magnitude of program voltage VPGM, thereby stably controlling the voltage dividing path. As a result, leakage current does not flow through the voltage dividing path, and therefore program voltage VPGM is generated with a stable magnitude.

Figure 3:
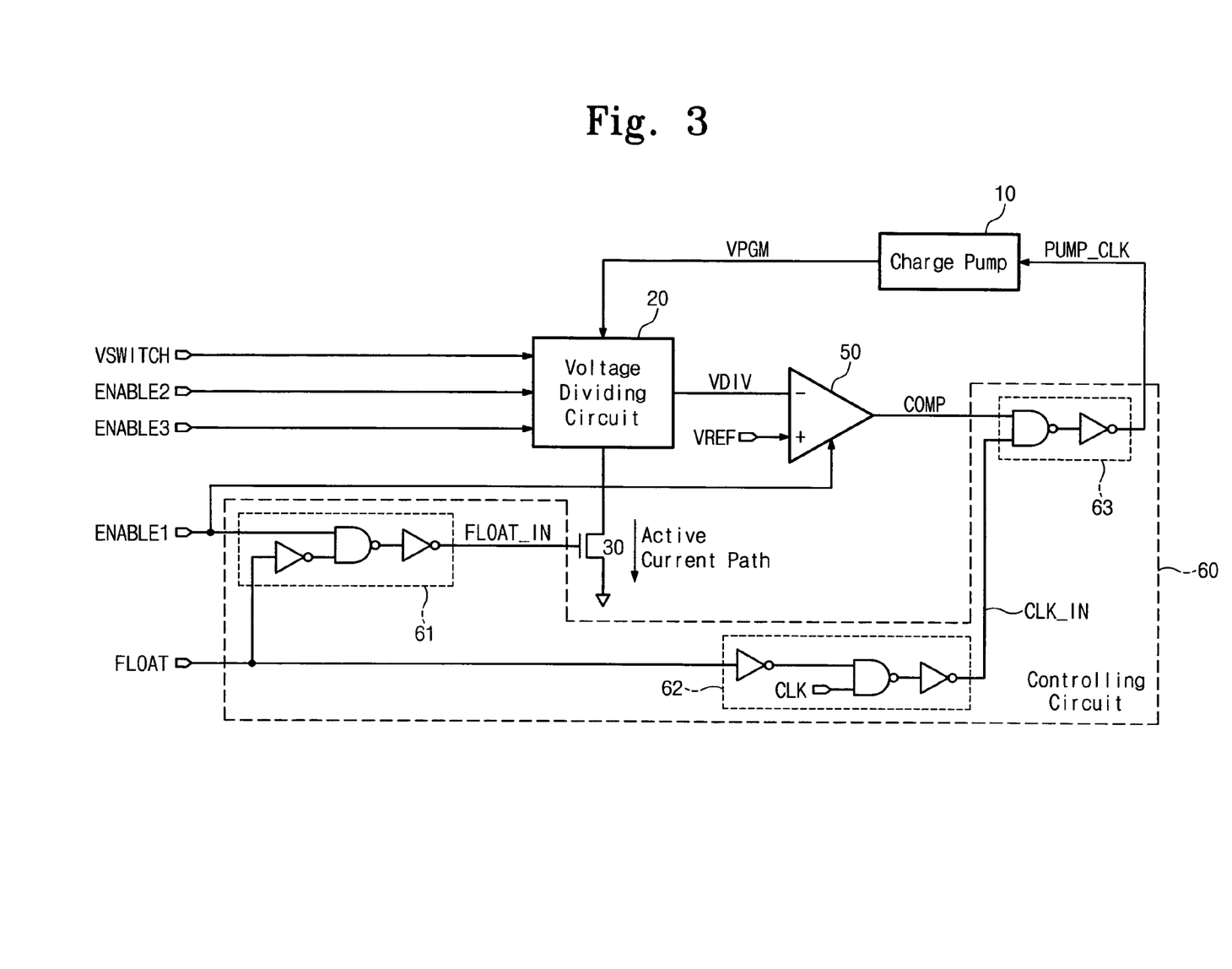
FIG. 3 is a block diagram of a high voltage generating circuit illustrated in FIG. 2 according to an embodiment of the present invention.

FIG. 3 is a block diagram of high voltage generating circuit 100 according to one embodiment of the invention. Referring to FIG. 3, high voltage generating circuit 100 comprises a charge pump 10, a voltage dividing circuit 20, a discharging circuit 30, a comparing circuit 50, and a controlling circuit 60.

Charge pump 10 generates program voltage VPGM in response to a pumping clock signal PUMP_CLK generated by controlling circuit 60. Pumping clock signal PUMP_CLK is deactivated during a program verification period "V" to prevent overshooting in program voltage VPGM. Consequently, charge pump 10 does not perform a pumping operation during program verification period "V".

For explanation purposes, various operations of high voltage generating circuit 100 will be described with reference to program verification period "V" and a program period "P". However, it should be understood that these operations and accompanying conditions are generally representative of operations and conditions during other program verification periods and program periods, such as those repetitively occurring throughout a program operation.

Program voltage VPGM generated by charge pump 10 is provided to voltage dividing circuit 20 and then divided in accordance with resistances in voltage dividing circuit 20. A voltage dividing path of voltage dividing circuit 20 is determined in accordance with a switching voltage VSWITCH and second and third enable signals ENABLE2 and ENABLE3.

Discharging circuit 30 is connected between voltage dividing circuit 20 and ground. Discharging circuit 30 selectively activates a discharge path between voltage dividing circuit 20 and ground in response to an internal floating signal FLOAT_IN generated by controlling circuit 60.

Voltage dividing circuit 20 is activated to perform a voltage dividing operation during a period where the discharge path is activated by discharging circuit 30. The voltage dividing operation divides switching voltage VSWITCH to produce a divided voltage result VDIV. During a period where the discharge path is deactivated, voltage dividing circuit 20 is in a floating state. Where voltage dividing circuit 20 is in the floating state, the discharge path is deactivated, or cut off. As a result, leakage current out of voltage dividing circuit 20 is prevented and program voltage VPGM is not modified based on divided voltage result VDIV.

Divided voltage result VDIV is input to comparing circuit 50. Comparing circuit 50 compares divided voltage result VDIV with a reference voltage VREF to generate a compare signal COMP.

Controlling circuit 60 generates pumping clock signal PUMP_CLK in response to compare signal COMP, a clock signal CLK, and a floating control signal FLOAT generated by controller 180. Floating control signal FLOAT is deactivated during program period "P", in which program voltage VPGM is activated. Floating control signal FLOAT is activated during program verification period "V", in which program voltage VPGM is deactivated. Controlling circuit 60 causes pumping clock signal PUMP_CLK to be deactivated during periods where floating control signal FLOAT is activated. Consequently, pumping clock signal PUMP_CLK is always deactivated during program verification period "V" regardless of a value of compare signal COMP.

Controlling circuit 60 also generates an internal float signal FLOAT_IN based on a logical combination of first enable signal ENABLE1 and floating control signal FLOAT. Controlling circuit 60 controls internal float signal FLOAT_IN to always be deactivated during periods where floating control signal FLOAT is activated. Consequently, the discharge path of high voltage generating circuit 100 is cut off during program verification period "V" and voltage dividing circuit 20 stays in a floating state. The structure and operation of controlling circuit 60 is described in further detail below with reference to FIG. 4.

Although only one charge pump 10 is illustrated in FIG. 3, a plurality of pumping circuits may be included in high voltage generating circuit 100. Such additional pumping circuits could be used, for example, to generate voltages for different operations of the flash memory device, such as the pass voltage, the decoupling voltage, the read voltage, or switching voltage VSWITCH.

Figure 4:
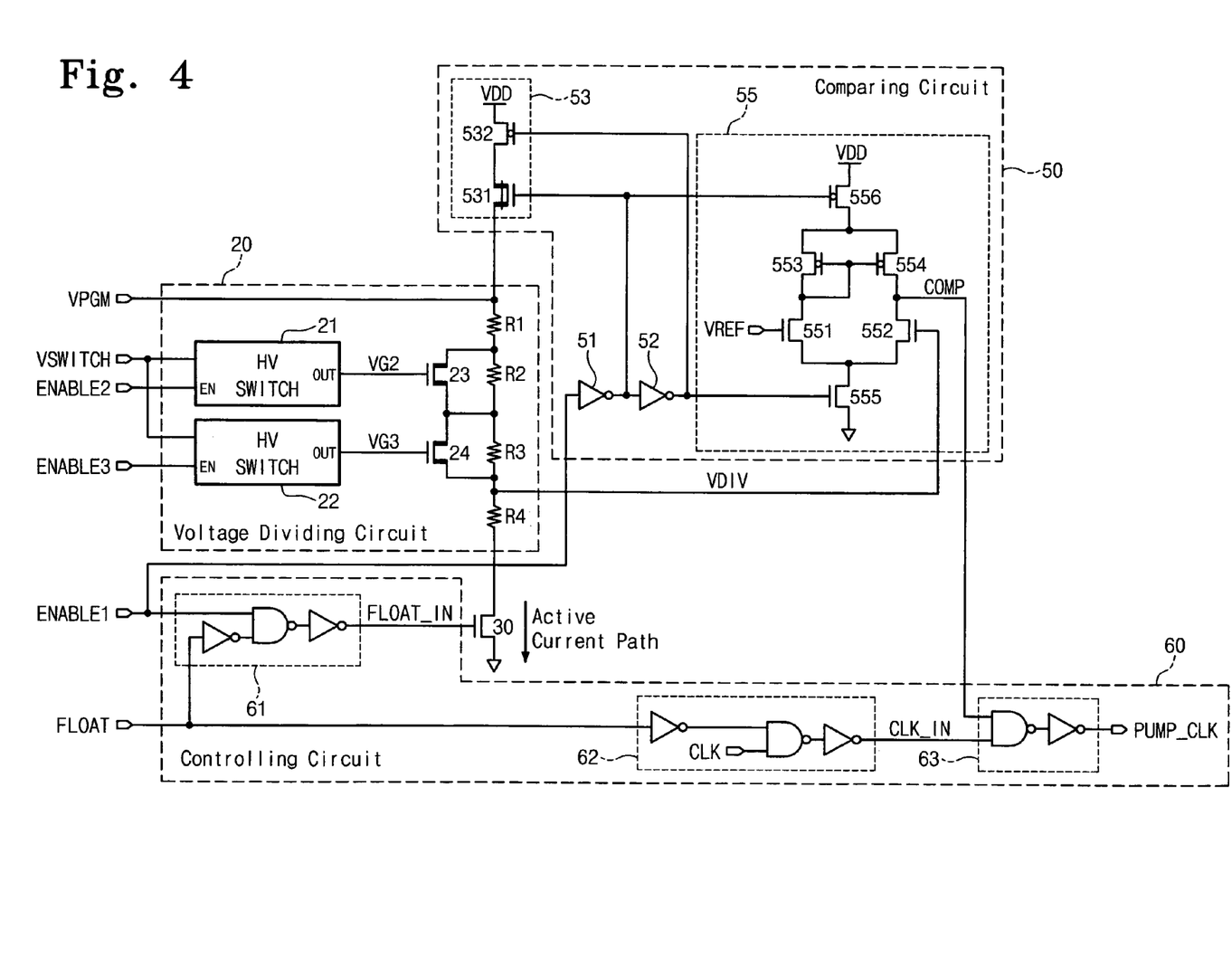
FIG. 4 is a circuit diagram of the high voltage generating circuit illustrated in FIG. 2.

FIG. 4 is a circuit diagram of high voltage generating circuit 100. Although not shown in FIG. 4, charge pump 10 is also used with high voltage generating circuit 100 shown in FIG. 4.

Referring to FIG. 4, discharging circuit 30 comprises a metal oxide semiconductor (MOS) transistor turned on/off in response to internal float signal FLOAT_IN generated by controlling circuit 60. Internal float signal FLOAT_IN is activated when first enable signal ENABLE1 is activated and floating control signal FLOAT is deactivated. Internal float signal FLOAT_IN is deactivated when first enable signal ENABLE1 is activated and floating control signal FLOAT is deactivated. First enable signal ENABLE1 is applied to comparing circuit 50 and controlling circuit 60 and is used for activating a high voltage generating operation.

Floating control signal FLOAT is activated during a period (e.g., program verification period "V") where a high voltage generated by high voltage generating circuit 100 is not used, and disables the discharge path between discharging circuit 30 and ground.

Discharge circuit 30 is turned on during program period "P" and turned off during program verification period "V" in response to internal float signal FLOAT_IN generated by controlling circuit 60. Voltage dividing circuit 20 performs a normal voltage dividing operation in response to switching voltage VSWITCH and second third enable signals ENABLE2 and ENABLE3 during a period where discharging circuit 30 is turned on. During periods where discharging circuit 30 is turned off, the discharge path between discharging circuit 30 and ground is cut off such that voltage dividing circuit 20 remains in the floating state.

Voltage dividing circuit 20 comprises a plurality of high voltage switches 21 and 22, a plurality of resistances R1 through R4, and a plurality of switching transistors 23 and 24. Switching voltage VSWITCH is commonly applied to high voltage switches 21 and 22. Each of high voltage switches 21 and 22 selectively outputs switching voltage VSWITCH in response to corresponding enable signals ENABLE2 and ENABLE3. Switching voltages selectively output from high voltage switches 21 and 22 will be referred to as gate control voltages VG2 and VG3, respectively.

A plurality of resistances RI through R4 are connected in series to divide program voltage VPGM generated by charge pump 10. Resistance R1 receives program voltage VPGM from charge pump 10. Resistance R4 is connected to ground through discharging circuit 30. Discharging circuit 30 is turned on by the activated internal float signal FLOAT_IN to activate the discharge path between resistances R1 through R4 and ground. Where the discharge path of voltage dividing circuit 20 is activated, a voltage dividing operation of voltage dividing circuit 20 is activated.

Switching transistors 23 and 24 are connected in parallel with resistances R2 and R3. Gate controlling voltages VG2 and VG3 generated are applied to respective gate terminals of switching transistors 23 and 24. Switching transistors 23 and 24 are turned on/off in response to gate controlling voltages VG2 and VG3, respectively. Based on the turn-on/off of switching transistors 23 and 24, a current is cut off from/ provided to corresponding resistances R2 and R3. That is, according to the turn-on/off of switching transistors 23 and 24, a voltage dividing path of voltage dividing circuit 20 is changed, and a total resistance value used to divide program voltage VPGM is changed. The magnitude of program voltage VPGM is generally higher than that of a power voltage VDD used to power the flash memory device. Accordingly, switching transistors 23 and 24 are generally high voltage transistors.

The alteration of the voltage dividing path according to the turn-on/off of switching transistors 23 and 24 is described below in further detail. For example, where enable signal ENABLE2 is activated (e.g., assumes a logic level "high") and enable signal ENABLE3 is deactivated (e.g., assumes logic level "low"), control voltage VG2 is activated and gate controlling voltage VG3 is deactivated. In this case, switching transistor 23 is turned on and switching transistor 24 is turned off. Consequently, the voltage dividing path of resistance R2 is deactivated and the voltage dividing path of the resistance R3 is activated. Therefore, program voltage VPGM is divided by resistance R1, R3, and R4. The divided voltage result VDIV is $$VDIV = \frac{R4}{R1+R3+R4}VPGM.$$

For example, where enable signals ENABLE2 and ENABLE3 are activated and gate controlling voltages VG2 and VG3 are activated, switching transistors 23 and 24 are turned on. Consequently, the voltage dividing paths of resistances R2 and R3 are deactivated. At this point, program voltage VPGM is divided by resistances R1 and R4. Accordingly, divided voltage result VDIV is $$VDIV = \frac{R4}{R1+R4}VPGM.$$

Where switching transistors 23 and 24 are fully turned on by gate controlling voltages VG2 and VG3, program voltage VPGM, which typically has a magnitude of about 20 V, is apparent at both drain and source regions of switching transistors 23 and 24. However, where gate controlling voltages VG2 and VG3 fall below the magnitude of program voltage VPGM, switching transistors 23 and 24 may only be partially turned on. As a result, some current may flow through resistances R2 and R3 rather than through switching transistors 23 and 24.

Where current flows through resistances R2 and R3 rather than through switching transistors 23 and 24, a total resistance value for divided voltage result VDIV changes, or becomes inaccurate. To address this problem, program voltage VPGM input to high voltage generating circuit 100 as switching voltage VSWITCH, and gate controlling voltages VG2 and VG3 are generated using switching voltage VSWITCH. As a result, gate controlling voltages VG2 and VG3 maintain a level equal to program voltage VPGM.

Referring to FIGS. 3 and 4, gate control voltages VG2 and VG3 have lower magnitudes than program voltage VPGM during program verification period "V" where program voltage VPGM is not applied to the selected word line. One reason for this is that a voltage lower than program voltage VPGM, for example, read voltage VREAD, power voltage VDD, or ground voltage GND may be set as a switching voltage VSWITCH during program verification period "V".

To address this problem, embodiments of the invention cut off the discharge path of high voltage generating circuit 100 and deactivate pumping clock signal PUMP_CLK during program verification period "V". Consequently, leakage current is prevented during program verification period "V" and a pumping operation of charge pump 10 is suspended. Accordingly, overshooting of program voltage VPGM does not occur during program verification period "V".

Comparing circuit 50 comprises a differential amplifying circuit 55 comparing divided voltage result VDIV generated by voltage dividing circuit 20 with reference voltage VREF. Comparing circuit 50 further comprises first and second inverters 51 and 52 and a power voltage controlling unit 53 adapted to prevent circuit devices constituting differential amplifying circuit 55 from being damaged by high voltages.

First inverter 51 inverts first enable signal ENABLE1. Second inverter 52 inverts an output of first inverter 51. Power voltage controlling unit 53 comprises first and second power voltage controlling transistors 531 and 532 connected in series between power voltage VDD and program voltage VPGM. Respective outputs of first and second inverters 51 and 52 are applied to gate terminals of first and second power voltage controlling transistors 531 and 532. First and second power voltage controlling transistors 531 and 532 are turned off to prevent program voltage VPGM from being directly applied to comparing circuit 50 and controlling circuit 60 when first enable signal ENABLE1 is activated. Consequently, low voltage circuits in comparing circuit 50 and controlling circuit 60 are not damaged.

Differential amplifying circuit 55 comprises a first transistor 551 having a gate terminal receiving program voltage VPGM, a second transistor 552 having a gate terminal receiving divided voltage result VDIV, and a discharge transistor 555 commonly connected to respective source terminals of first and second transistors 551 and 552. Although not shown in the drawings, reference voltage VREF may be generated by dividing a voltage such as power voltage VDD.

First and second transistors 551 and 552 and discharge transistor 555 each comprise negative metal oxide semiconductor (NMOS) transistors. First enable signal ENABLE1 is applied to a gate of discharge transistor 555. A drain terminal of discharge transistor 555 is commonly connected to respective source terminals of first and second transistors 551 and 552. A source terminal of discharge transistor 555 is connected to ground. Discharge transistor 555 discharges a current supplied from first and second transistors 551 and 552 in response to first enable signal ENABLE1 applied to the gate of discharge transistor 555. Third and fourth transistors 553 and 554 are connected to respective drain terminals of first and second transistors 551 and 552. Third and fourth transistors 553 and 554 each comprise positive metal oxide semiconductor (PMOS) transistors. A drain terminal of the sixth transistor 556 is connected to respective source terminals of third and fourth transistors 553 and 554.

First and second transistors 551 and 552 receive reference voltage VREF and divided voltage result VDIV generated by voltage dividing circuit 20, at their respective gate terminals. Accordingly, the respective current driving abilities of first and second transistors 551 and 552 vary according to the respective magnitudes of reference voltage VREF and divided voltage result VDIV. Current flowing through first and second transistors 551 and 552 is discharged through discharge transistor 555.

For example, where the magnitude of divided voltage result VDIV is lower than that of reference voltage VREF, the current driving ability of second transistor 552 becomes smaller than that of first transistor 551. Accordingly, second transistor 552 discharges current with a smaller magnitude than first transistor 551. Consequently, the drain voltage of first transistor 551 becomes lower than that of second transistor 552. The lowered drain voltage of first transistor 551 is applied to respective gate terminals of third and fourth transistors 553 and 554 to enhance the current driving abilities of third and fourth transistors 553 and 554, and to activate a compare signal COMP.

For example, where the magnitude of divided voltage result VDIV greater than that of reference voltage VREF, the current driving ability of second transistor 552 becomes larger than that of first transistor 551. Accordingly, second transistor 552 discharges current with a higher magnitude than first transistor 551. Consequently, the drain voltage of first transistor 551 becomes higher than that of second transistor 552. The raised drain voltage of first transistor 551 is applied to the respective gate terminals of third and fourth transistors 553 and 554 to decrease the current driving abilities of third and fourth transistors 553 and 554, and to deactivate compare signal COMP.

Compare signal COMP generated by comparing circuit 50 is input into controlling circuit 60. Controlling circuit 60 generates a pumping clock signal PUMP_CLK in response to input compare signal COMP and an internal clock signal CLK_IN. Controlling circuit 60 deactivates internal clock signal CLK_IN and pumping clock signal PUMP_CLK during periods (e.g., program verification period "V") where a floating control signal FLOAT is activated. Accordingly, compare signal COMP generated by comparing circuit 50 during program verification period "V" does not affect the logic state of pumping clock signal PUMP_CLK.

Controlling circuit 60 comprises first, second and third logic circuits 61 through 63. First logic circuit 61 receives first enable signal ENABLE1 and floating control signal FLOAT to generate internal floating signal FLOAT_IN. Internal clock signal CLK_IN is activated where first enable signal ENABLE1 is activated and floating control signal FLOAT is deactivated. Floating control signal FLOAT is deactivated during program period "P" and has an activated value during program verification period "V".

The discharge path between discharge circuit 30 and ground is activated in response to activation of internal floating signal FLOAT_IN. During program period "P", internal floating signal FLOAT_IN is activated and program voltage VPGM is activated. At this point, voltage dividing circuit 20 performs a normal voltage dividing operation.

During program verification period "V", internal floating signal FLOAT_IN is deactivated and program voltage VPGM is deactivated. A discharge path between discharge circuit 30 and ground is cut of in response deactivation of internal floating signal FLOAT_IN. Consequently, voltage dividing circuit 20 is maintained in a floating state and leakage current is blocked. Accordingly, the previously generated program voltage VPGM remains substantially unaltered.

Second logic circuit 62 receives floating control signal FLOAT and clock signal CLK to generate internal clock signal CLK_IN. Second logic circuit 62 activates internal clock signal CLK_IN in response to clock signal CLK during periods (e.g., program period "P") where floating control signal FLOAT is deactivated. Clock signal CLK is a clock signal used to operate the flash memory device. Internal clock signal CLK_IN typically has a period identical to that of clock signal CLK, but may have different periods according to various conditions. Second logic circuit 62 deactivates internal clock signal CLK_IN during periods (e.g., program verification period "V") where floating control signal FLOAT is activated.

Third logic circuit 63 generates pumping clock signal PUMP_CLK in response to internal clock signal CLK_IN and compare signal COMP. Compare signal COMP is activated where divided voltage result VDIV has a lower magnitude than reference voltage VREF and thus pumping is required. Pumping clock signal PUMP_CLK is activated where internal clock signal CLK_IN and compare signal COMP are activated. Therefore, pumping clock signal PUMP_CLK is always deactivated regardless of a value of compare signal COMP during periods where internal floating signal FLOAT_IN is deactivated, such as program verification period "V".

According to the above structure, current does not leak out of high voltage generating circuit 100 and pumping clock signal PUMP_CLK is deactivated during program verification period "V". In addition, a pumping operation of charge pump 10 is restrained during program verification period "V" to prevent overshooting of program voltage VPGM. Where current leaks out of high voltage generating circuit 100 and a pumping operation of charge pump 10 is not restrained during program verification period "V", program voltage VPGM may undesirably change as illustrated in FIG. 5.

Figure 5:
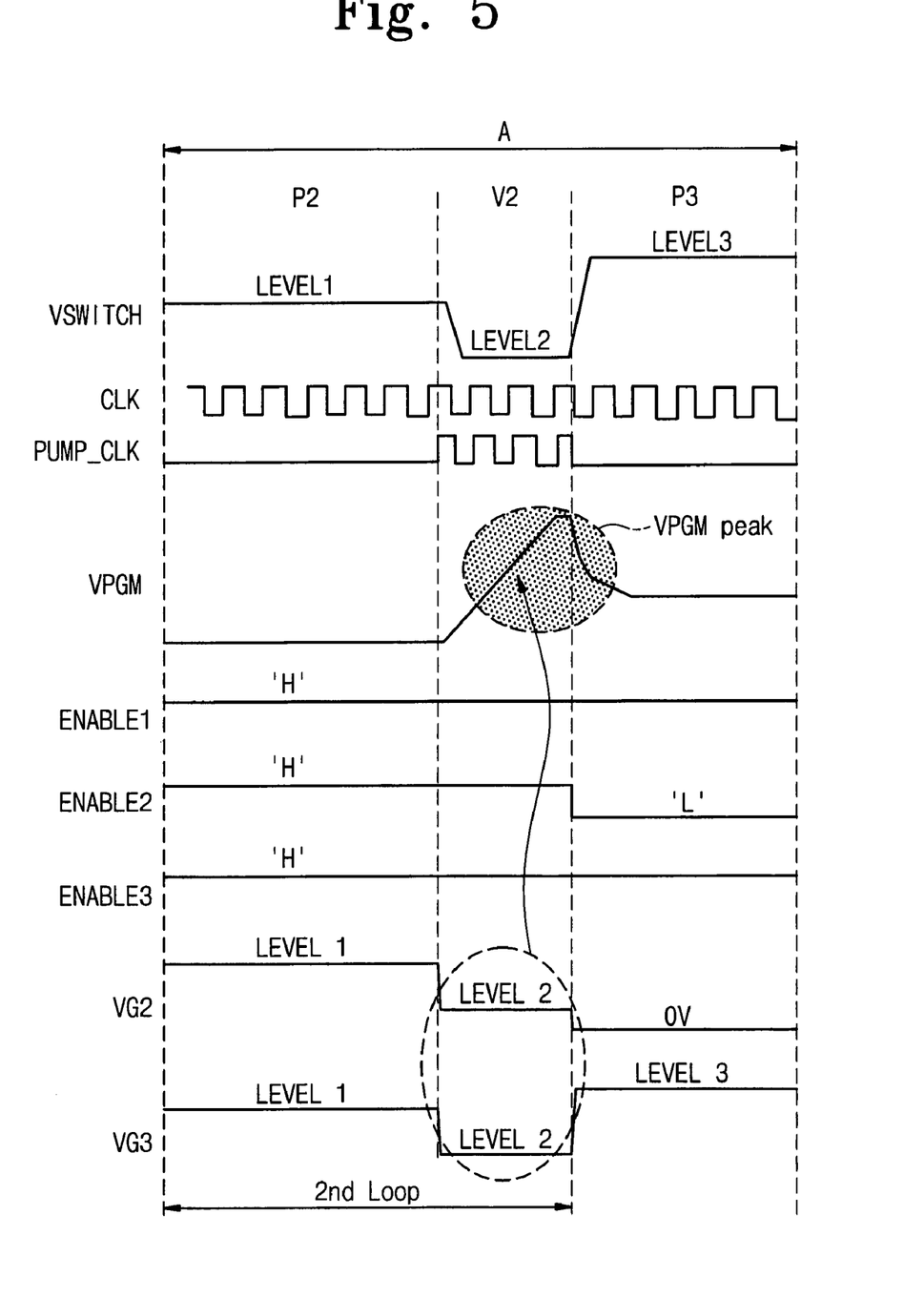
FIG. 5 is a waveform timing diagram illustrating the operation of a high voltage generating circuit similar to that illustrated in FIG. 2, but having a leakage current or an improperly controlled charge pumping operation during a program verification period "V"
Figure 6:
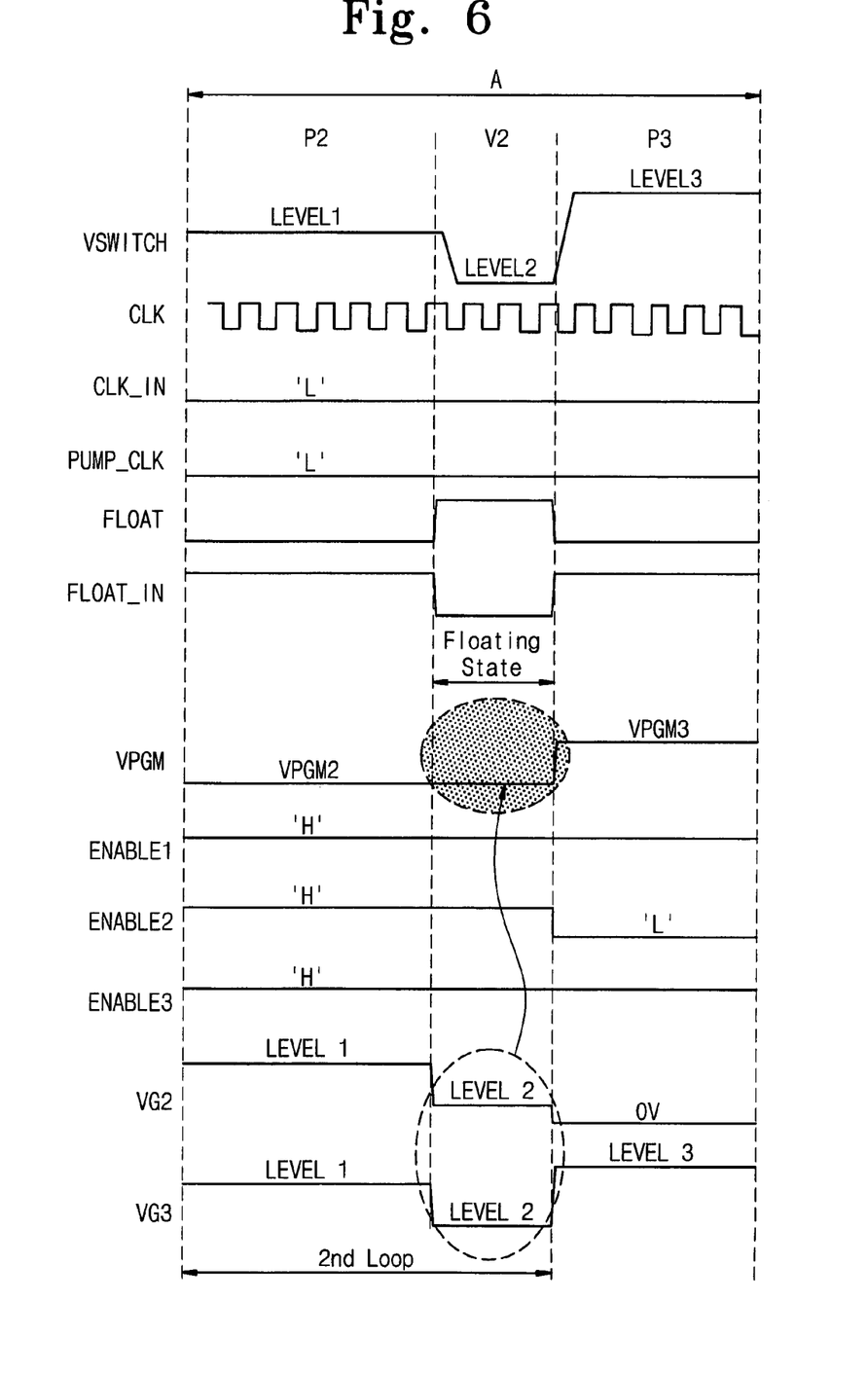
FIG. 6 is a waveform timing diagram illustrating the operation of the high voltage generating circuit illustrated in FIG. 2.

FIG. 5 is a waveform timing diagram illustrating a change of program voltage VPGM when current leaks out of high voltage generating circuit 100 or a pumping operation of charge pump 10 is not properly controlled during program verification period "V". FIG. 6 is a waveform timing diagram illustrating the proper operation of high voltage generating circuit 100 according to an embodiment of the present invention. Comparing the diagrams of FIGS. 5 and 6, overshooting occurs in the timing diagram of FIG. 5, but not in the timing diagram of FIG. 6.

Referring to FIG. 5, a voltage level of switch voltage VSWITCH varies in successive program loops. For example, switch voltage VSWITCH has magnitudes LEVEL1 and LEVEL3 identical to or higher than program voltage VPGM during program periods P2 and P3 where program voltage VPGM is applied to memory cell array 150. Accordingly, gate control voltages VG2 and VG3 also have magnitudes LEVEL1 and LEVEL3 identical to or higher than program voltage VPGM during program periods P2 and P3. However, switch voltage VSWITCH drops to magnitude LEVEL2 corresponding to read voltage VREAD during program verification period V2 where program voltage VPGM is not applied to memory cell array 150. During program verification period V2, program voltage VPGM is deactivated and read voltage VREAD is activated to be applied to the selected word line.

Where the magnitude of switch voltage VSWITCH drops below the magnitude of read voltage VREAD, the respective magnitudes of gate control voltages VG2 and VG3 may drop. Accordingly, switching transistors 23 and 24 may not be sufficiently turned on. Accordingly, leakage current may flow through into resistances R2 and R3. Due to the leakage current, the total resistance in the voltage dividing path used to produce divided voltage result VDIV decreases. The lowered divided voltage result VDIV activates pumping clock signal PUMP_CLK. Charge pump 10 performs a pumping operation in response to pumping clock signal PUMP_CLK generated during program verification period V2. Consequently, program voltage VPGM increases during program verification period V2, resulting in overshooting of program voltage VPGM. As a result, additional time is required to stabilize program voltage VPGM before the beginning of program period P3.

In addition to requiring extra time to stabilize program voltage VPGM, the overshooting problem also increases power consumption due to the pumping operation of charge pump 10. Unfortunately, both of these factors have negative effects on the performance of the flash memory device.

To address this problem, as illustrated in FIG. 6, floating control signal FLOAT is activated during program verification period V2. Consequently, internal floating signal FLOAT_IN is deactivated to prevent current from leaking out of high voltage generating circuit 100. At this point, internal clock signal CLK_IN and pumping clock signal PUMP_CLK are deactivated. Consequently, the pumping operation of charge pump 10 is prevented during program verification period "P" such that overshooting due to the charge pumping operation of charge pump 10 does not occur.

A period where current is prevented from being discharged from high voltage generating circuit 100 through the discharge path through discharging path 30 will be referred to as a floating period. During the floating period, voltage dividing circuit 20 maintains a floating state. Accordingly, the level of program voltage VPGM generated in previous program period P2 remains substantially constant.

According to selected embodiments of the invention, leakage current is prevented in voltage dividing circuit 20, charge pump 10, compare circuit 50, and controlling circuit 60 during program verification period "V". In addition, overshooting is prevented from occurring in high voltages generated by high voltage generating circuit 100. Accordingly, a high voltage for a flash memory device can be steadily generated.

The foregoing embodiments of the invention are disclosed as teaching examples. Those skilled in the art will understand that various changes in form and detail can be made to the disclosed embodiments without departing from the scope of the invention.

What is claimed:

1. A flash memory device, comprising:
   a memory cell array comprising a plurality of memory cells arranged at intersections of a plurality of word lines and bit lines;
   a high voltage generating circuit adapted to generate a high voltage to be applied to a selected word line among the plurality of word lines to select one or more memory cells among the plurality of memory cells; and
   a controller adapted to cut off a discharge path between the high voltage generating circuit and ground during a first period where the high voltage is not applied to any of the plurality of word lines, and further adapted to deactivate the high voltage generating circuit during the first period.

2. The flash memory device of claim 1, wherein the high voltage generating circuit comprises:
   a charge pump adapted to generate the high voltage in response to a pumping clock signal;
   a voltage dividing circuit adapted to divide the high voltage to produce a divided voltage result, wherein the discharge path is located between the voltage dividing circuit and ground;
   a discharging circuit adapted to activate the discharge path in response to an internal floating signal;
   a comparing circuit adapted to compare the divided voltage result with a reference voltage to produce a compare signal; and
   a controlling circuit adapted to generate the pumping clock signal in response to the compare signal, further adapted to deactivate the pumping clock signal in response to a control signal output by the controller during the first period, and further adapted to deactivate the internal floating signal; and
   wherein the discharge circuit cuts off the discharge path in response to the deactivated internal floating signal.

3. The flash memory device of claim 2, wherein the high voltage is one of a program voltage, a pass voltage, a decoupling voltage, and a read voltage.

4. The flash memory device of claim 2, wherein the controlling circuit comprises:
   a first logic circuit adapted to deactivate the internal floating signal during the first period;
   a second logic circuit adapted to generate a deactivated internal clock signal in response to the deactivated internal floating signal; and
   a third logic circuit adapted to deactivate the pumping clock signal in response to the deactivated internal clock signal.

5. The flash memory device of claim 1, wherein the first period comprises a program verification period and wherein a second period comprises a program period where the high voltage is applied to the selected word line.

6. The flash memory device of claim 5, wherein the high voltage is maintained at the same magnitude during the first and second periods.

7. The flash memory device of claim 1, wherein the flash memory device is a NAND flash memory device.

8. A high voltage generating circuit, comprising:
   a charge pump adapted to generate a high voltage in response to a pumping clock signal;
   a voltage dividing circuit adapted to divide the high voltage to produce a divided voltage result;
   a discharging circuit adapted to activate a discharge path located between the voltage dividing circuit and ground in response to an internal floating signal;
   a comparing circuit adapted to compare the divided voltage result with a reference voltage to produce a compare signal; and
   a controlling circuit adapted to generate the pumping clock signal in response to the compare signal, further adapted to deactivate the pumping clock signal in response to a control signal output by the controller during a first period, and further adapted to deactivate the internal floating signal; and
   wherein the discharge circuit cuts off the discharge path in response to the deactivated internal floating signal.

9. The high voltage generating circuit of claim 8, wherein the high voltage is one of a program voltage, a pass voltage, a decoupling voltage, and a read voltage.

10. The high voltage generating circuit of claim 8, wherein the controlling circuit comprises:
    a first logic circuit adapted to deactivate the internal floating signal during the first period;
    a second logic circuit adapted to generate a deactivated internal clock signal in response to the deactivated internal floating signal; and
    a third logic circuit adapted to deactivate the pumping clock signal in response to the deactivated internal clock signal.

11. The high voltage generating circuit of claim 8, wherein the first period comprises a program verification period and wherein a second period comprises a program period where the high voltage is applied to the selected word line.

12. The high voltage generating circuit of claim 11, wherein the high voltage is maintained at the same magnitude during the first and second periods.

* * * * *